US011296678B1

(12) United States Patent
Gathman et al.

(10) Patent No.: US 11,296,678 B1
(45) Date of Patent: Apr. 5, 2022

(54) COMPLEMENTARY CURRENT-MODE BIQUAD WITH HIGH LINEARITY

(71) Applicant: QUALCOMM Incorporated, San Diego, CA (US)

(72) Inventors: Timothy Donald Gathman, San Diego, CA (US); Lai Kan Leung, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/136,723

(22) Filed: Dec. 29, 2020

(51) Int. Cl.
*H03H 11/00* (2006.01)
*H03H 11/04* (2006.01)

(52) U.S. Cl.
CPC ......... *H03H 11/0461* (2013.01); *H03H 11/00* (2013.01); *H03H 2210/025* (2013.01)

(58) Field of Classification Search
CPC ......... H03H 11/0461; H03H 2210/025; H03H 11/00
See application file for complete search history.

(56) References Cited

U.S. PATENT DOCUMENTS

| 5,495,200 | A  | * | 2/1996  | Kwan    | H03H 19/004 |
|           |    |   |         |         | 327/553     |
| 7,843,287 | B2 | * | 11/2010 | Masuda  | H03H 11/42  |
|           |    |   |         |         | 333/215     |
| 9,148,183 | B2 | * | 9/2015  | Alzaher | H03H 11/11  |
| 2009/0191833 | A1 | * | 7/2009 | Kaczman | H03F 3/211  |
|           |    |   |         |         | 455/296     |
| 2015/0304155 | A1 | * | 10/2015 | Lin    | H04B 1/123  |
|           |    |   |         |         | 375/345     |

* cited by examiner

*Primary Examiner* — Dinh T Le
(74) *Attorney, Agent, or Firm* — Patterson+ Sheridan, L.L.P.

(57) ABSTRACT

Certain aspects of the present disclosure provide methods and apparatus for processing signals using a current-mode biquad filter, which may have a tunable bias current and/or tunable capacitance. One example apparatus is a current-mode biquad filter circuit that includes a first input current node, a first capacitive element coupled to the first input current node, a first output current node, a first active filter circuit coupled between the first input current node and the first output current node, and a second active filter circuit coupled between the first input current node and the first output current node. The second active filter circuit is complementary to the first active filter circuit.

26 Claims, 6 Drawing Sheets

COMPLEMENTARY CURRENT-MODE BIQUAD WITH HIGH LINEARITY

TECHNICAL FIELD

Certain aspects of the present disclosure generally relate to electronic circuits and, more particularly, to a current-mode biquad filter circuit for processing signals, for example.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

MSs and/or BSs may include a tunable active filter used, for example as a baseband filter in a receive chain or a transmit chain. The tunable active filter may be tuned to vary the center frequency ($f_0$) of the filter over a range of frequencies. For high quality factor (Q) and high $f_0$ filters, the Q and $f_0$ may vary due to process variations and component mismatch.

SUMMARY

Certain aspects of the present disclosure provide a current-mode biquad filter circuit. The current-mode biquad filter circuit generally includes a first input current node; a first capacitive element coupled to the first input current node; a first output current node; a first active filter circuit coupled between the first input current node and the first output current node; and a second active filter circuit coupled between the first input current node and the first output current node, the second active filter circuit being complementary to the first active filter circuit.

Certain aspects of the present disclosure provide a radio frequency front-end that includes a current-mode biquad filter circuit as described herein. The radio frequency front-end may also include a low-noise amplifier having an input configured to receive a radio frequency signal. The radio frequency front-end may further include a mixer having an input coupled to an output of the low-noise amplifier and having an output coupled to the first input current node of the current-mode biquad filter circuit.

Certain aspects of the present disclosure provide a method of signal processing. The method generally includes receiving an input current signal at an input current node of a current-mode biquad filter circuit. The current-mode biquad filter circuit also includes a capacitive element coupled to the input current node; an output current node; a first active filter circuit coupled between the input current node and the output current node; and a second active filter circuit coupled between the input current node and the output current node, the second active filter circuit being complementary to the first active filter circuit. The method also includes filtering the input current signal to generate an output current signal at the output current node using the current-mode biquad filter circuit.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
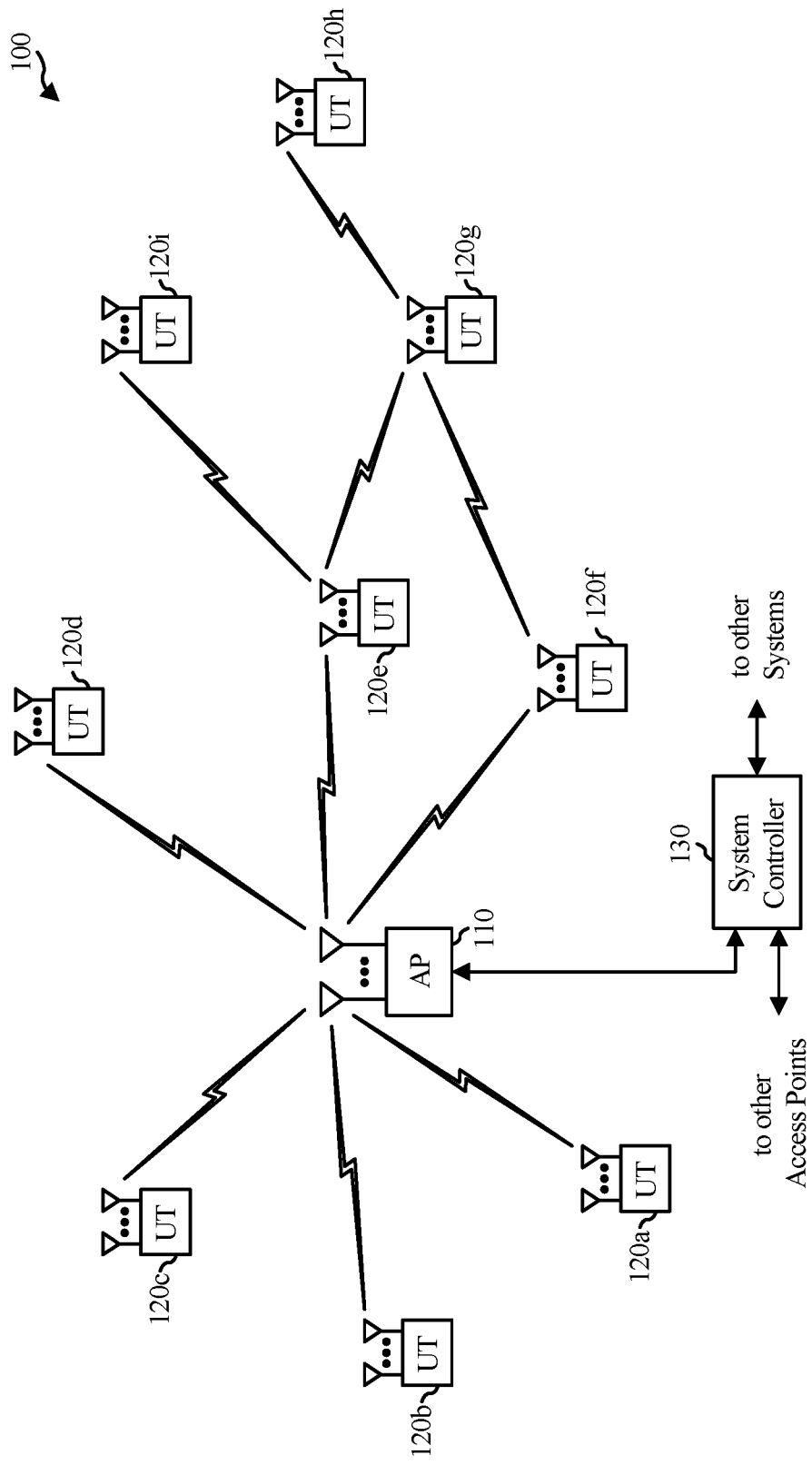
FIG. 1 is a diagram of an example wireless communications network, in accordance with certain aspects of the present disclosure.

Certain aspects of the present disclosure generally relate to methods and apparatus for processing signals using a folded current-mode biquad filter. The biquad filter may have a tunable transconductance (by adjusting bias current) and/or tunable capacitance.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

In certain aspects of the present disclosure, the access point 110 and/or user terminal 120 may include at least one current-mode biquad filter circuit for processing signals as described below.

Figure 2:
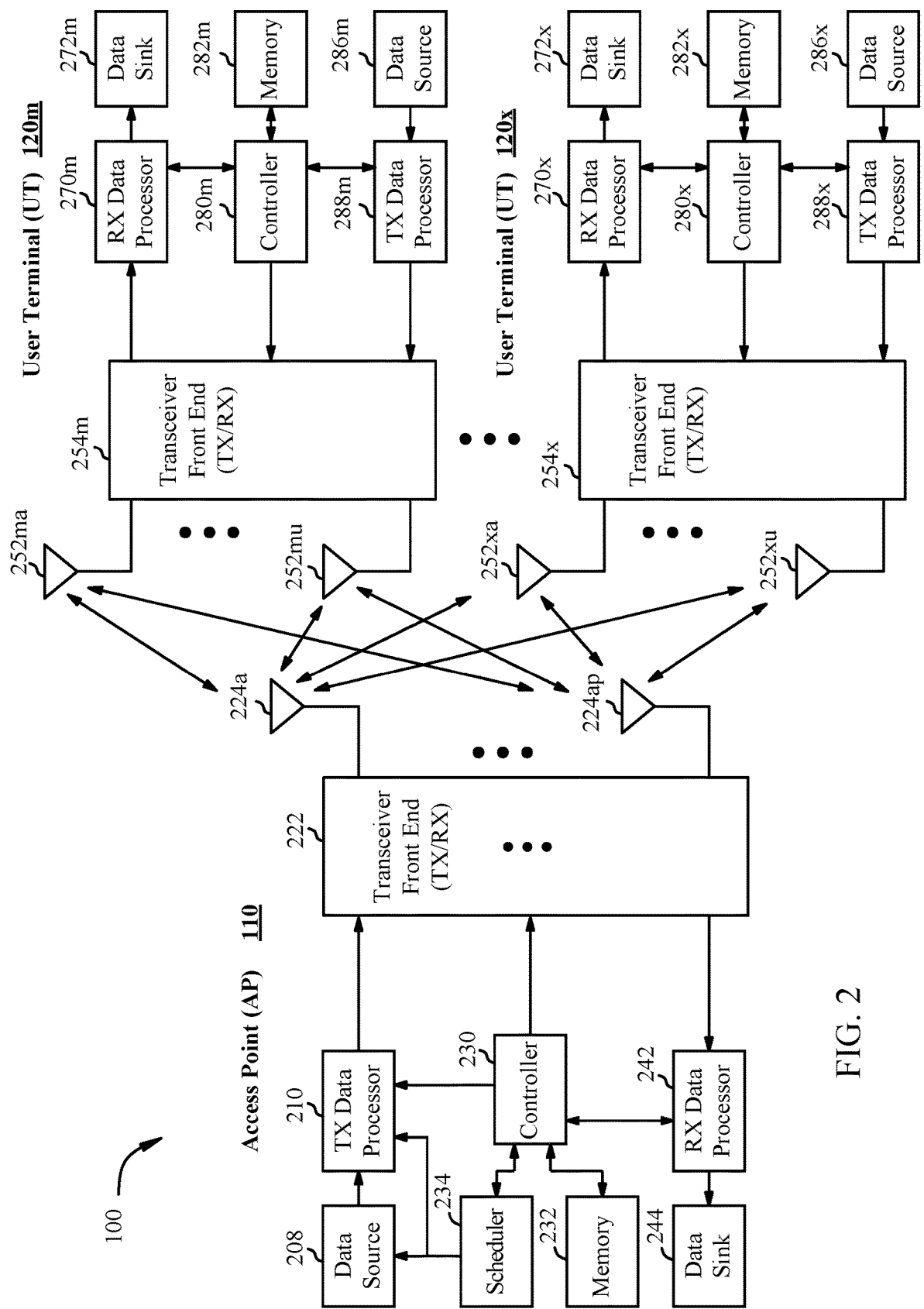
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to Nan, and $N_{up}$ and Nan may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front-end (TX/RX) 254 (also known as a radio frequency front-end (RFFE)) receives and processes (e.g., converts to analog, amplifies, filters, and frequency upconverts) a respective symbol stream to generate an uplink signal. The transceiver front-end 254 may also route the uplink signal to one of the $N_{ut,m}$ antennas for transmit diversity via an RF switch, for example. The controller 280 may control the routing within the transceiver front-end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front-end 222 may select signals received from one of the antennas 224 for processing. The signals received from multiple antennas 224 may be combined for enhanced receive diversity. The access point's transceiver front-end 222 also performs processing complementary to that performed by the user terminal's transceiver front-end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front-end (TX/RX) 222 of access point 110 and/or transceiver front-end 254 of user terminal 120 may include one or more current-mode biquad filter circuits for processing signals as described below.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front-end 222 receives and processes (e.g., converts to analog, amplifies, filters, and frequency upconverts) the symbol stream to generate a downlink signal. The transceiver front-end 222 may also route the downlink signal to one or more of the $N_{ap}$ antennas 224 for transmit diversity via an RF switch, for example. The controller 230 may control the routing within the transceiver front-end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front-end 254 may select signals received from one of the antennas 252 for processing. The signals received from multiple antennas 252 may be combined for enhanced receive diversity. The user terminal's transceiver front-end 254 also performs processing complementary to that performed by the access point's transceiver front-end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
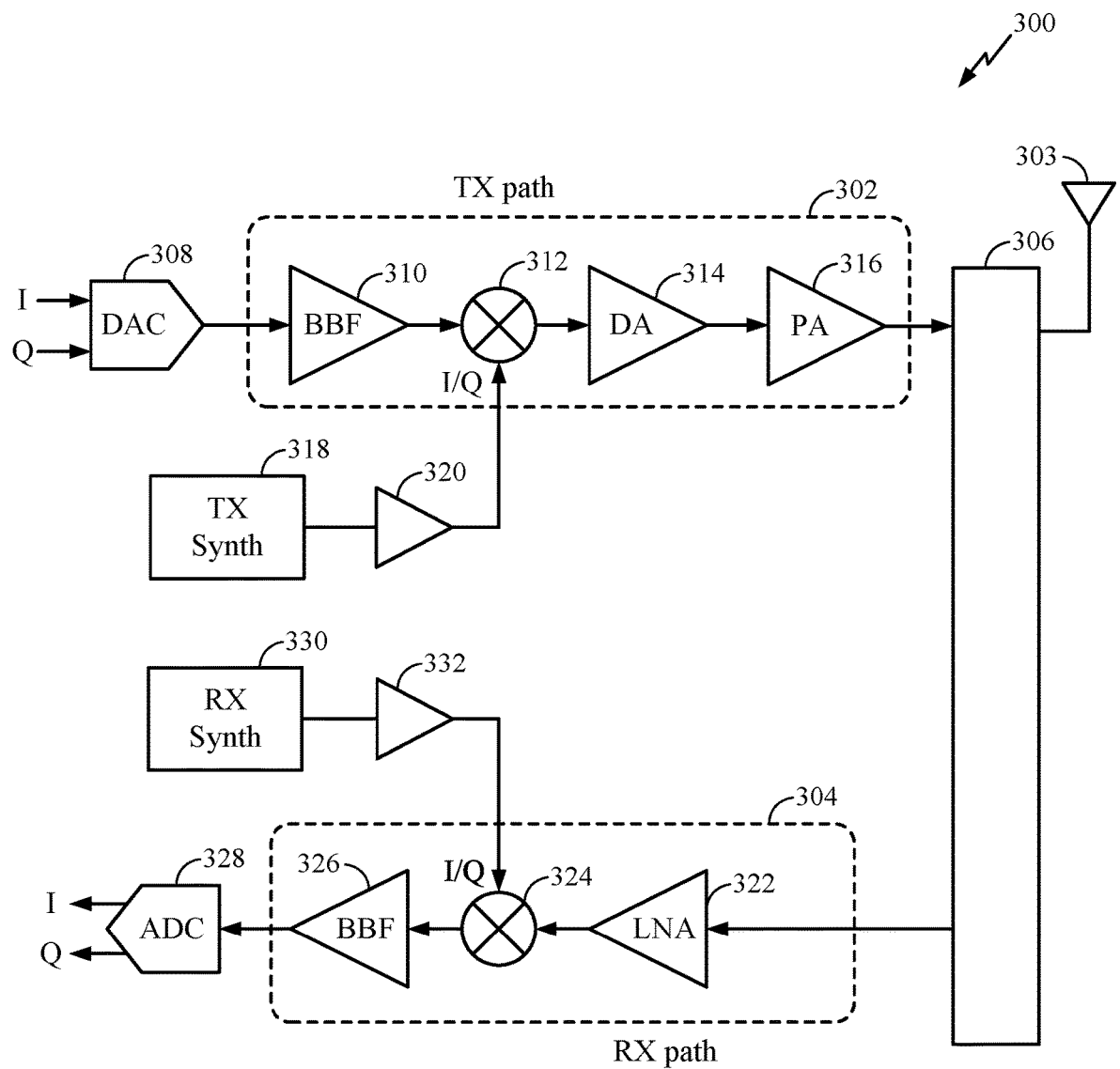
FIG. 3 is a block diagram of an example transceiver front-end, in accordance with certain aspects of the present disclosure.

FIG. 3 is a block diagram of an example transceiver front-end 300, such as transceiver front-ends 222, 254 in FIG. 2, in which aspects of the present disclosure may be practiced. The transceiver front-end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In some aspects of the present disclosure, the BBF 326 may include one or more current-mode biquad filter circuits for processing signals as described below. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

An Example Current-Mode Biquad Filter Circuit

Certain wireless communication networks (e.g., New Radio (NR), also referred to as 5G, which is the fifth generation of mobile phone standards and technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), etc. These services may support communications with lower latency and higher throughput than earlier generations, such as 3G, 4G (the fourth generation of mobile phone standards and technology). However, compared to earlier generations, these 5G services may include stricter latency and bandwidth requirements. As a reference example, 5G mmW may utilize a significantly larger bandwidth (e.g., 10× or greater) than 4G.

Current receiver (RX) architectures are generally insufficient to meet the bandwidth specifications associated with 5G communication services, such as 5G mmW. For example, some 4G RX architectures may use a closed-loop feedback topology, which can limit the bandwidth capability of the RX architecture (e.g., to below 100 megahertz (MHz)). Moreover, even in RX architectures that do employ open-loop architectures and/or passive components, the resonant (e.g., LC) filter generally has limited reconfigurability and tuning range to cover lower bandwidth modes. Accordingly, it may be desirable to provide a RX architecture that can meet higher bandwidth capabilities (e.g., greater than 100 MHz) and that has improved reconfigurability, relative to conventional RX architectures.

Figure 4:
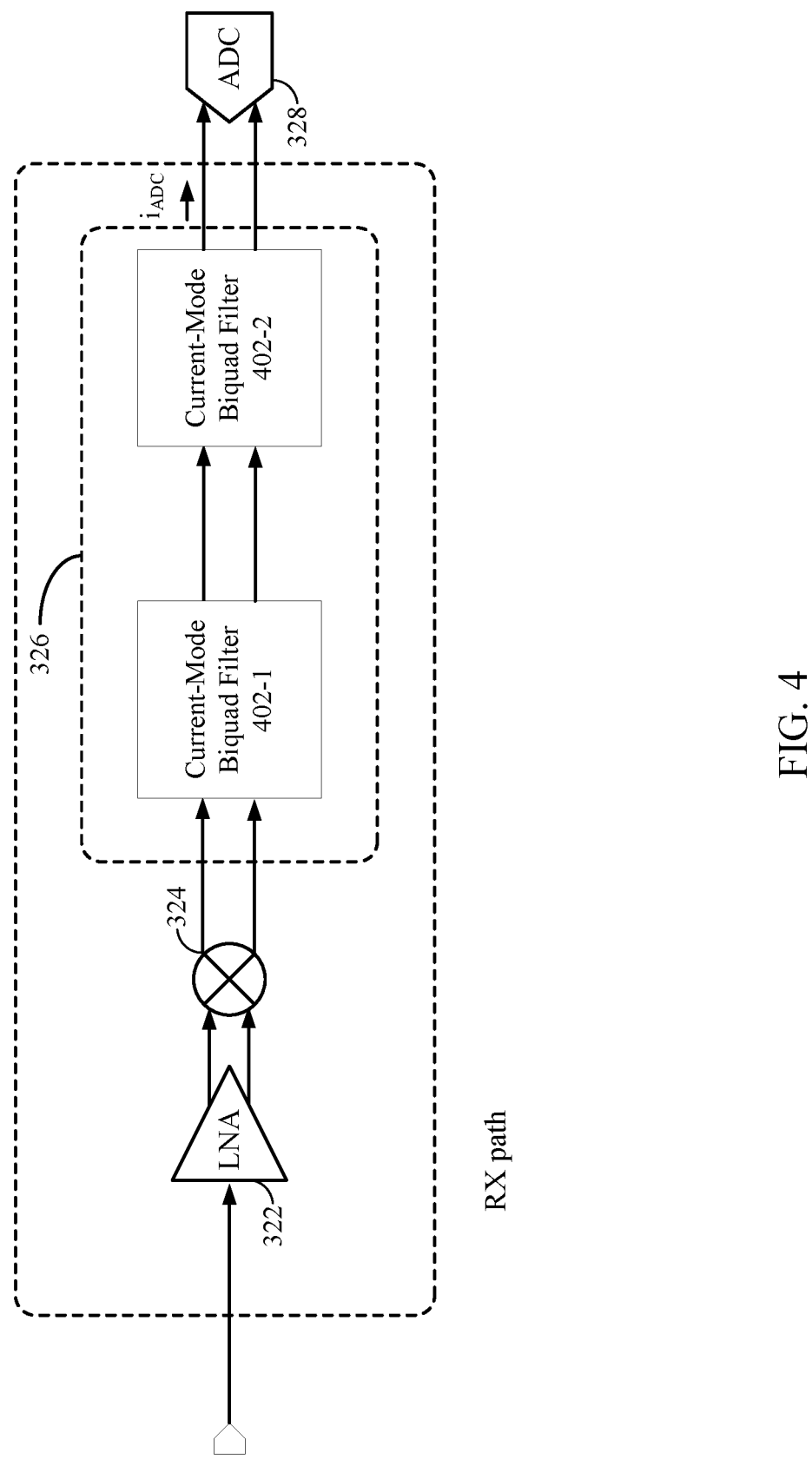
FIG. 4 is a block diagram of a baseband filter with multiple cascaded current-mode biquad filter circuits, in accordance with certain aspects of the present disclosure.

Aspects presented herein describe a RX architecture with a baseband filter (e.g., BBF 326) that can support higher bandwidths (e.g., up to 1 gigahertz (GHz)) for 5G mmW. FIG. 4 is a block diagram of an example RX architecture 400, according to certain aspects of the present disclosure. The RX architecture 400 includes the LNA 322, mixer 324, and BBF 326. Here, the BBF 326 may filter baseband signals output by the mixer 324. There are many different circuit topologies for implementing filters in electronic circuits, such as a baseband filter (e.g., BBF 326) in a receive chain of a radio frequency front-end. One example filter topology using one or more amplifiers (e.g., an active topology) is referred to as a biquadratic (or biquad) filter. A biquad filter is a type of linear filter for implementing a transfer function that is the ratio of two quadratic functions, hence the name "biquadratic."

In one aspect, the baseband filter of the RX architecture described herein can include at least one current-mode biquad filter circuit, for example, to support higher bandwidths for 5G mmW. As shown in FIG. 4, for example, the BBF 326 includes a current-mode biquad filter 402-1 and a current-mode biquad filter 402-2, which is cascaded with the current-mode biquad filter 402-1, to achieve an overall fourth-order filter. Note that while FIG. 4 depicts the BBF 326 with two cascaded current-mode biquad filters 402, in other aspects, the BBF 326 can include any number (e.g., one, two, three, etc.) of current-mode biquad filters 402.

In one aspect, the BBF 326 may be an inductorless baseband circuit that can support higher bandwidths (e.g., up to 1 GHz or greater for 5G mmW), relative to baseband filters in conventional RX architectures. The BBF 326 may have a tunable GM (e.g., via adjustable bias current) over the larger bandwidth and/or a tunable capacitor for full reconfigurability. In some aspects, the BBF 326 may output current signals to a current-mode ADC, while in other aspects, a load resistor may be used to convert the output current signals to voltage signals before being received by an ADC (e.g., ADC 328).

Figure 5:
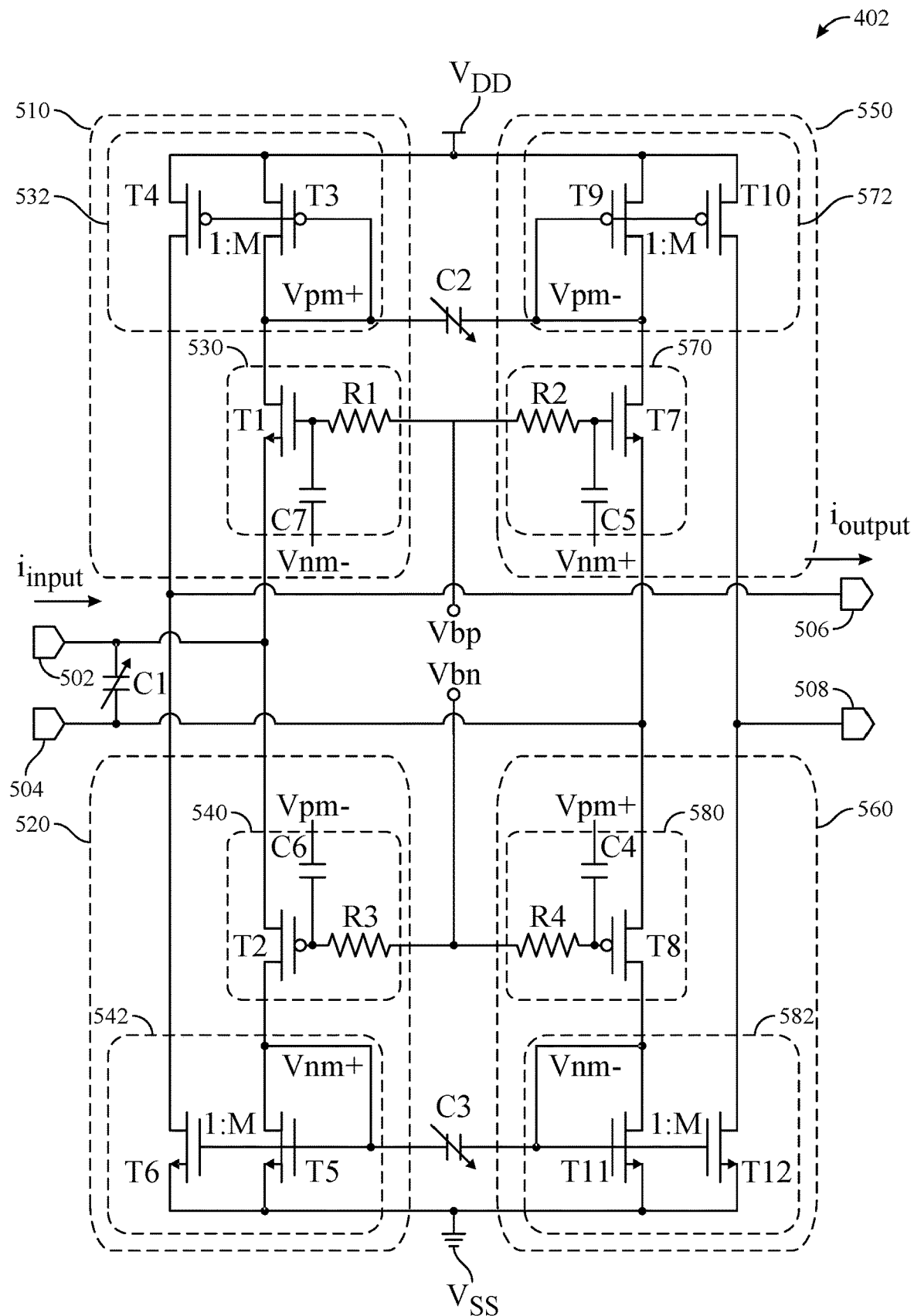
FIG. 5 is a schematic diagram of an example current-mode biquad filter, in accordance with certain aspects of the present disclosure.

FIG. 5 is a schematic diagram of an example current-mode biquad filter 402 (e.g., current-mode biquad filter 402-1, current-mode biquad filter 402-2, etc.), according to certain aspects of the present disclosure. The current-mode biquad filter 402 includes an input current node 502 (e.g., $I_{input+}$), an input current node 504 (e.g., $I_{input-}$), an output current node 506 (e.g., $I_{output+}$), an output current node 508 (e.g., $I_{output-}$), an active filter circuit 510, an active filter circuit 520, an active filter circuit 550, and an active filter circuit 560. The input current nodes 502 and 504 may receive a differential input current signal pair (e.g., $I_{input+}/I_{input-}$), and the output current nodes 506 and 508 may output a differential output current signal pair (e.g., $I_{output+}/I_{output-}$) from the current-mode biquad filter 402.

The active filter circuit 510 and the active filter circuit 520 are complementary to each other. Each of the active filter circuits 510 and 520 is coupled between the input current node 502 and the output current node 506. The active filter circuit 510 includes a common-gate circuit 530, which drives a current mirror circuit 532. For example, transistor T1 of common-gate circuit 530 drives a first branch (e.g., transistor T3) of current mirror circuit 532, which in turn controls a second branch (e.g., transistor T4) of current mirror circuit 532.

Similarly, the active filter circuit 520 includes a common-gate circuit 540, which drives a current mirror circuit 542. For example, transistor T2 of common-gate circuit 540 drives a first branch (e.g., transistor T5) of current mirror circuit 542, which in turn controls a second branch (e.g., transistor T6) of current mirror circuit 542. In the complementary active filter circuits 510 and 520, (i) the source of transistor T1 and the source of transistor T2 are coupled to the input current node 502, and (ii) the drain of transistor T4 and the drain of transistor T6 are coupled to the output current node 506.

In some aspects, the ratio between the size of transistor T3 and the size of transistor T4 (e.g., the current mirror ratio 1:M) is tunable. In some aspects, the ratio between the size of transistor T5 and the size of transistor T6 is tunable. To implement a tunable transistor, a switched array of parallel transistors may be used, where the gates of selected transistors are selectively coupled to a control input node and where the gates of unselected transistors are selectively coupled to a voltage rail (e.g., VDD or ground), to turn off the unselected transistors. By changing the effective number of parallel transistors in this manner, the current mirror ratio 1:M is tunable. In some aspects, the ratio between the size of transistor T3 and the size of transistor T4 may be equal to the ratio between the size of transistor T5 and the size of transistor T6.

As also shown, the active filter circuit 550 and the active filter circuit 560 are complementary to each other. Each of the active filter circuits 550 and 560 is coupled between the input current node 504 and the output current node 508. The active filter circuit 550 includes a common-gate circuit 570, which drives a current mirror circuit 572. For example, transistor T7 of common-gate circuit 570 drives a first branch (e.g., transistor T9) of current mirror circuit 572, which in turn controls a second branch (e.g., transistor T10) of current mirror circuit 572.

Similarly, the active filter circuit 560 includes a common-gate circuit 580, which drives a current mirror circuit 582. For example, transistor T8 of common-gate circuit 580 drives a first branch (e.g., transistor T11) of current mirror circuit 582, which in turn controls a second branch (e.g., transistor T12) of current mirror circuit 582. In the complementary active filter circuits 550 and 560, (i) the source of transistor T7 and the source of transistor T8 are coupled to the input current node 504, and (ii) the drain of transistor T10 and the drain of transistor T12 are coupled to the output current node 508.

In some aspects, the ratio between the size of transistor T9 and the size of transistor T10 is tunable. In some aspects, the ratio between the size of transistor T11 and the size of transistor T12 is tunable. In some aspects, the ratio between the size of transistor T9 and the size of transistor T10 may be equal to the ratio between the size of transistor T11 and the size of transistor T12. In some aspects, each of the current mirror circuits 532, 542, 572, and 582 may have the same ratio between the sizes of the transistors in the respective current mirror circuits, as indicated in FIG. 5 by ratio M.

Transistors T1 and T7 in common-gate circuits 530 and 570, respectively, may be n-type field-effect transistors (NFETs), as illustrated in FIG. 5. Transistors T2 and T8 in common-gate circuits 540 and 580, respectively, may be p-type field-effect transistors (PFETs) as shown. Transistors T3, T4, T9, and T10 in current mirror circuits 532 and 572 may be PFETs, whereas transistors T5, T6, T11, and T12 in current mirror circuits 542 and 582 may be NFETs, as depicted in FIG. 5. In this manner, active filter circuit 510 and active filter circuit 520 are complementary to each other. Likewise, active filter circuit 550 and active filter circuit 560 are complementary to each other.

In some aspects, the current-mode biquad filter 402 may implement one or more tunable capacitors and/or tunable bias current (e.g., to tune GM). As shown in FIG. 5, for example, the current-mode biquad filter 402 includes (i) a tunable capacitor C1 coupled between the input current node 502 and the input current node 504, (ii) a tunable capacitor C2 coupled between the active filter circuit 510 and the active filter circuit 550, and (iii) a tunable capacitor C3 coupled between the active filter circuit 520 and the active filter circuit 560. Note, however, that while FIG. 5 depicts three tunable capacitors C1, C2, and C3, the current-mode biquad filter 402 can include any number of tunable capacitors (e.g., any combination of capacitors C1, C2, and C3 may be tunable). Furthermore, it is to be understood that a tunable capacitor (such as capacitor C1, C2, and/or C3) may be implemented by a switched array of capacitors (also referred to as a "tunable capacitor bank"). In some aspects, such a switched array of capacitors may be implemented by a binary-weighted capacitor bank, for example.

As also shown in FIG. 5, the current-mode biquad filter 402 includes biasing nodes Vbp and Vbn, which are configured to tune a transconductance of one or more transistors in the current-mode biquad filter 402. For example, the positive biasing node Vbp can be configured to tune transconductances of transistor T1 and transistor T7, where the gate of transistor T1 is coupled to capacitor C7 and to biasing node Vbp via resistor R1, and the gate of transistor T7 is coupled to capacitor C5 and to biasing node Vbp via resistor R2. In some aspects, at least one of resistor R1, resistor R2, capacitor C5, and capacitor C7 is variable.

Similarly, the negative biasing node Vbn can be configured to tune transconductances transistor T2 and transistor T8, where the gate of transistor T2 is coupled to capacitor C6 and to biasing node Vbn via resistor R3, and the gate of transistor T8 is coupled to capacitor C4 and to biasing node Vbn via resistor R4. In some aspects, at least one of resistor R3, resistor R4, capacitor C4, and capacitor C6 is variable.

In some aspects, the current mirror circuit of each active filter circuit may be coupled to the common-mode gate circuit in a different active filter circuit. For example, the first branch of current mirror circuit 532 includes transistor T3, which has a source coupled to VDD (e.g., a voltage rail) and has a drain coupled to (i) the gate of transistor T3, (ii) the output of common-gate circuit 530, and (iii) the gate of transistor T8 via capacitor C4 (e.g., Vpm+). Additionally, the first branch of current mirror circuit 542 includes transistor T5, which has a source coupled to Vss (e.g., a voltage rail, such as electrical ground for the circuit) and has a drain coupled to (i) the gate of transistor T5, (ii) the output of common-gate circuit 540, and (iii) the gate of transistor T7 via capacitor C5 (e.g., Vnm+). Additionally, the first branch of current mirror circuit 572 includes transistor T9, which has a source coupled to VDD and has a drain coupled to (i) the gate of transistor T9, (ii) the output of common-gate circuit 570, and (iii) the gate of transistor T2 via capacitor C6 (e.g., Vpm−). Additionally, the first branch of current mirror circuit 582 includes transistor T11, which has a source coupled to Vss and has a drain coupled to (i) the gate of transistor T11, (ii) the output of common-gate circuit 580, and (iii) the gate of transistor T1 via capacitor C7 (e.g., Vnm−). In this manner, the gates of the transistors are cross-coupled.

Figure 6:
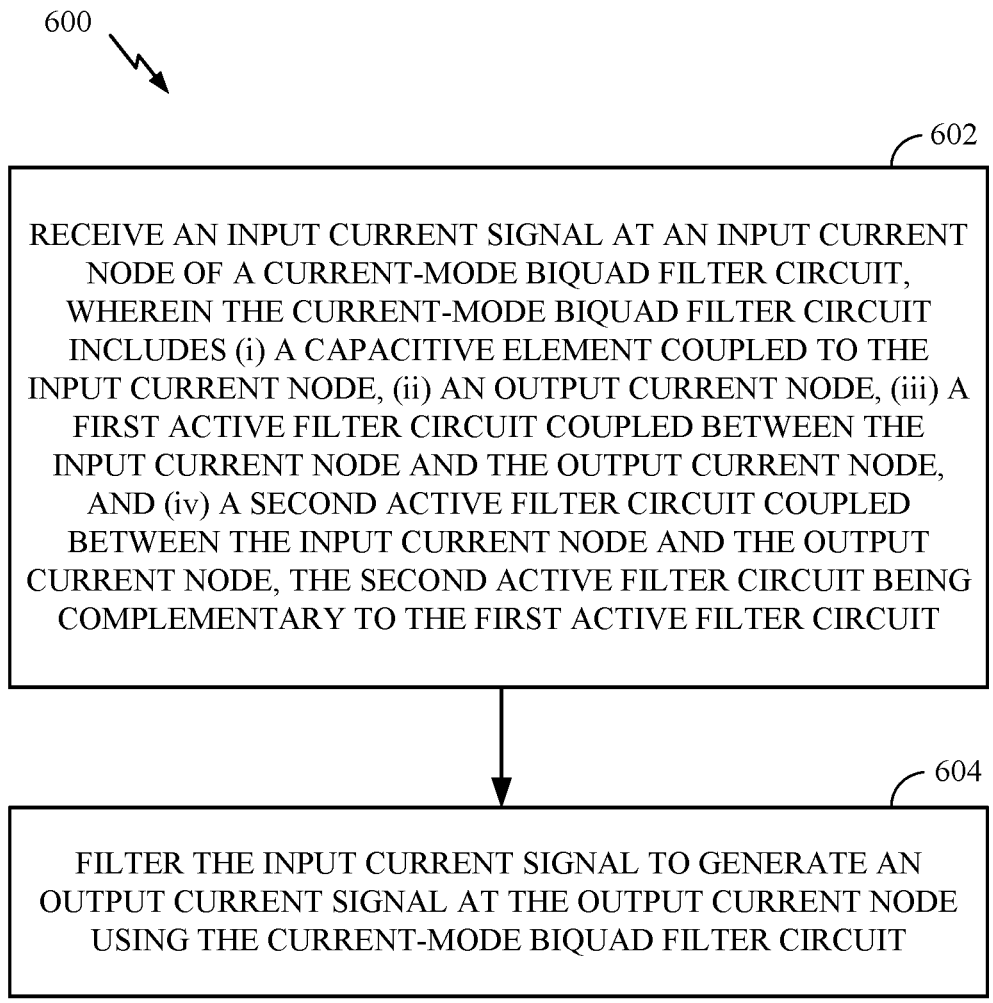
FIG. 6 is a flow diagram of example operations for signal processing, in accordance with certain aspects of the present disclosure.

FIG. 6 is a flow diagram of example operations 600 for processing signals, in accordance with certain aspects of the present disclosure. The operations 600 may be performed by a circuit, such as the current-mode biquad filter 402.

The operations 600 begin, at block 602, by receiving an input current signal at an input current node (e.g., input current node 502) of a current-mode biquad filter circuit (e.g., current-mode biquad filter 402-1). The current-mode biquad filter circuit may include (i) a capacitive element (e.g., capacitor C1) coupled to the input current node, (ii) an output current node (e.g., output current node 506), (iii) a first active filter circuit (e.g., active filter circuit 510) coupled between the input current node and the output current node, and (iv) a second active filter circuit (e.g., active filter circuit 520) coupled between the input current node and the output current node. The second active filter circuit may be complementary to the first active filter circuit.

At block 604, the circuit filters the input current signal to generate an output current signal at the output current node using the current-mode biquad filter circuit.

According to certain aspects, the circuit (e.g., current-mode biquad filter circuit 420-1) may be cascaded with another circuit (e.g., current-mode biquad filter circuit 420-2). According to certain aspects, the circuit may be included within a radio frequency front-end. In these aspects, the radio frequency front-end may also include a LNA (e.g., LNA 322) having an input configured to receive a radio frequency signal, and a mixer (e.g., mixer 324) having an input coupled to an output of the LNA and having an output coupled to the input current node of the circuit.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front-end 254 of the user terminal 120 depicted in FIG. 2, the transceiver front-end 222 of the access point 110 shown in FIG. 2, or the transceiver front-end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front-end 300 depicted in FIG. 3). Means for receiving may comprise a receiver (e.g., the transceiver front-end 254 of the user terminal 120 depicted in FIG. 2, the transceiver front-end 222 of the access point 110 shown in FIG. 2, or the transceiver front-end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front-end 300 depicted in FIG. 3). Means for processing, means for determining, and means for operating may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A current-mode biquad filter circuit comprising:
a first input current node;
a first capacitive element coupled to the first input current node;
a first output current node;
a first active filter circuit coupled between the first input current node and the first output current node; and
a second active filter circuit coupled between the first input current node and the first output current node, the second active filter circuit being complementary to the first active filter circuit.

2. The current-mode biquad filter circuit of claim 1, wherein at least one of the first active filter circuit or the second active filter circuit comprises a tunable transconductance.

3. The current-mode biquad filter circuit of claim 2, wherein the first capacitive element comprises a tunable capacitor.

4. The current-mode biquad filter circuit of claim 1, wherein:
the first active filter circuit comprises:
a first common-gate circuit having an input coupled to the first input current node; and
a first current mirror circuit having a first branch coupled to an output of the first common-gate circuit and having a second branch coupled to the first output current node; and
the second active filter circuit comprises:
a second common-gate circuit having an input coupled to the first input current node; and
a second current mirror circuit having a first branch coupled to an output of the second common-gate circuit and having a second branch coupled to the first output current node.

5. The current-mode biquad filter circuit of claim 4, further comprising a first biasing node and a second biasing node, wherein:
the first common-gate circuit comprises a first transistor having a source coupled to the first input current node, having a drain coupled to the first branch of the first current mirror circuit, and having a gate coupled to the first biasing node; and
the second common-gate circuit comprises a second transistor having a source coupled to the first input current node, having a drain coupled to the first branch of the second current mirror circuit, and having a gate coupled to the second biasing node.

6. The current-mode biquad filter circuit of claim 5, wherein the first biasing node is configured to tune a transconductance of the first transistor and wherein the second biasing node is configured to tune a transconductance of the second transistor.

7. The current-mode biquad filter circuit of claim 5, wherein:
the first branch of the first current mirror circuit comprises a third transistor having a source coupled to a first voltage rail and having a drain coupled to a gate of the third transistor and to the output of the first common-gate circuit;
the second branch of the first current mirror circuit comprises a fourth transistor having a source coupled to the first voltage rail, having a drain coupled to the first output current node, and having a gate coupled to the gate of the third transistor;
the first branch of the second current mirror circuit comprises a fifth transistor having a source coupled to a second voltage rail and having a drain coupled to a gate of the fifth transistor and to the output of the second common-gate circuit; and
the second branch of the second current mirror circuit comprises a sixth transistor having a source coupled to the second voltage rail, having a drain coupled to the first output current node, and having a gate coupled to the gate of the fifth transistor.

8. The current-mode biquad filter circuit of claim 7, wherein:
a ratio between a size of the third transistor and a size of the fourth transistor is equal to a ratio between a size of the fifth transistor and a size of the sixth transistor; and
the ratio between the size of the third transistor and the size of the fourth transistor is tunable.

9. The current-mode biquad filter circuit of claim 5, further comprising:
a second input current node, wherein the first capacitive element is coupled between the first input current node and the second input current node;
a second output current node;
a third active filter circuit coupled between the second input current node and the second output current node; and
a fourth active filter circuit coupled between the second input current node and the second output current node, the fourth active filter circuit being complementary to the third active filter circuit.

10. The current-mode biquad filter circuit of claim 9, further comprising:
a second capacitive element coupled between the first active filter circuit and the third active filter circuit; and
a third capacitive element coupled between the second active filter circuit and the fourth active filter circuit.

11. The current-mode biquad filter circuit of claim 10, wherein at least one of the first capacitive element, the second capacitive element, or the third capacitive element comprises a tunable capacitor.

12. The current-mode biquad filter circuit of claim 10, wherein:
the third active filter circuit comprises:
a third common-gate circuit having an input coupled to the second input current node; and
a third current mirror circuit having a first branch coupled to an output of the third common-gate circuit and having a second branch coupled to the second output current node; and
the fourth active filter circuit comprises:
a fourth common-gate circuit having an input coupled to the second input current node; and
a fourth current mirror circuit having a first branch coupled to an output of the fourth common-gate circuit and having a second branch coupled to the second output current node.

13. The current-mode biquad filter circuit of claim 12, wherein:
the second capacitive element is coupled between the output of the first common-gate circuit and the output of the third common-gate circuit; and
the third capacitive element is coupled between the output of the second common-gate circuit and the output of the fourth common-gate circuit.

14. The current-mode biquad filter circuit of claim 12, wherein:
the third common-gate circuit comprises a third transistor having a source coupled to the second input current node, having a drain coupled to the first branch of the third current mirror circuit, and having a gate coupled to the first biasing node; and
the fourth common-gate circuit comprises a fourth transistor having a source coupled to the second input current node, having a drain coupled to the first branch of the fourth current mirror circuit, and having a gate coupled to the second biasing node.

15. The current-mode biquad filter circuit of claim 14, wherein:
the first biasing node is configured to tune a transconductance of at least one of the first transistor or the third transistor; and
the second biasing node is configured to tune a transconductance of at least one of the second transistor or the fourth transistor.

16. The current-mode biquad filter circuit of claim 14, wherein:
the first branch of the first current mirror circuit comprises a fifth transistor having a source coupled to a first voltage rail and having a drain coupled to a gate of the fifth transistor, to the output of the first common-gate circuit, and to the gate of the fourth transistor of the fourth common-gate circuit;
the first branch of the second current mirror circuit comprises a sixth transistor having a source coupled to a second voltage rail and having a drain coupled to a gate of the sixth transistor, to the output of the second common-gate circuit, and to the gate of the third transistor of the third common-gate circuit;
the first branch of the third current mirror circuit comprises a seventh transistor having a source coupled to the first voltage rail and having a drain coupled to a gate of the seventh transistor, to the output of the third common-gate circuit, and to the gate of the second transistor of the second common-gate circuit; and
the first branch of the fourth current mirror circuit comprises an eighth transistor having a source coupled to the second voltage rail and having a drain coupled to a gate of the eighth transistor, to the output of the fourth common-gate circuit, and to the gate of the first transistor of the first common-gate circuit.

17. The current-mode biquad filter circuit of claim 16, wherein:
the second branch of the third current mirror circuit comprises a ninth transistor having a source coupled to the first voltage rail, having a drain coupled to the second output current node, and having a gate coupled to the gate of the seventh transistor; and
the second branch of the fourth current mirror circuit comprises a tenth transistor having a source coupled to the second voltage rail, having a drain coupled to the second output current node, and having a gate coupled to the gate of the eighth transistor.

18. The current-mode biquad filter circuit of claim 16, further comprising:
a fourth capacitive element coupled between the gate of the fifth transistor and the gate of the fourth transistor of the fourth common-gate circuit;
a fifth capacitive element coupled between the sixth transistor and the gate of the third transistor of the third common-gate circuit;
a sixth capacitive element coupled between the seventh transistor and the gate of the second transistor of the second common-gate circuit; and
a seventh capacitive element coupled between the eighth transistor and the gate of the first transistor of the first common-gate circuit.

19. A radio frequency front-end comprising the current-mode biquad filter circuit of claim 1, further comprising:
a low-noise amplifier having an input configured to receive a radio frequency signal; and
a mixer having an input coupled to an output of the low-noise amplifier and having an output coupled to the first input current node of the current-mode biquad filter circuit.

20. The radio frequency front-end of claim 19, further comprising another current-mode biquad filter circuit cascaded with the current-mode biquad filter circuit.

21. The radio frequency front-end of claim 19, further comprising an analog-to-digital converter (ADC), wherein the current-mode biquad filter circuit is included in a baseband filter (BBF), the BBF being coupled to the ADC.

22. The radio frequency front-end of claim 21, further comprising another current-mode biquad filter circuit cascaded with the current-mode biquad filter circuit and included in the BBF.

23. The radio frequency front-end of claim 21, wherein the ADC comprises a current-mode ADC and wherein the BBF is configured to output current signals to the current-mode ADC.

24. The radio frequency front-end of claim 21, further comprising a load resistor configured to convert current signals output from the BBF to voltage signals, wherein the ADC is configured to receive the voltage signals.

25. The current-mode biquad filter circuit of claim 1, further comprising a resistor coupled to the first output current node, the resistor being configured to convert current signals to voltage signals.

26. A method of signal processing, the method comprising:
receiving an input current signal at an input current node of a current-mode biquad filter circuit, wherein the current-mode biquad filter circuit further comprises:
a capacitive element coupled to the input current node;
an output current node;
a first active filter circuit coupled between the input current node and the output current node; and
a second active filter circuit coupled between the input current node and the output current node, the second active filter circuit being complementary to the first active filter circuit; and
filtering the input current signal to generate an output current signal at the output current node using the current-mode biquad filter circuit.

\* \* \* \* \*